(12) United States Patent
Tsai et al.

(10) Patent No.: US 7,855,567 B2
(45) Date of Patent: Dec. 21, 2010

(54) ELECTRONIC DEVICE TESTING SYSTEM AND METHOD

(75) Inventors: Su-Wei Tsai, Taipei (TW); Hsin-Hao Chen, Taipei County (TW)

(73) Assignee: Test Research, Inc., Taipei (TW)

( * ) Notice: Subject to any disclaimer, the term of this patent is extended or adjusted under 35 U.S.C. 154(b) by 217 days.

(21) Appl. No.: 12/060,817

(22) Filed: Apr. 1, 2008

(65) Prior Publication Data

US 2009/0243642 A1    Oct. 1, 2009

(51) Int. Cl.
*G01R 31/02* (2006.01)

(52) U.S. Cl. ...................................... 324/756

(58) Field of Classification Search .......... 324/754–758
See application file for complete search history.

(56) References Cited

U.S. PATENT DOCUMENTS

| | | | |
|---|---|---|---|
| 5,254,953 A | | 10/1993 | Crook et al. |
| 5,486,753 A | * | 1/1996 | Khazam et al. ............. 324/72.5 |
| 5,969,530 A | * | 10/1999 | Yamashita ................... 324/537 |
| 6,094,056 A | * | 7/2000 | Bardsley et al. ............. 324/754 |
| 6,104,198 A | * | 8/2000 | Brooks ........................ 324/538 |
| 6,744,267 B2 | * | 6/2004 | Sauk et al. ................... 324/754 |
| 6,903,360 B2 | * | 6/2005 | McAuliffe ............... 250/559.4 |
| 7,208,936 B2 | * | 4/2007 | Goldsmith et al. ........ 324/158.1 |
| 7,437,262 B2 | * | 10/2008 | Boose et al. ................. 702/122 |
| 7,612,568 B2 | * | 11/2009 | Chen et al. ................... 324/538 |
| 2008/0197867 A1 | * | 8/2008 | Wokhlu et al. .............. 324/755 |
| 2009/0089635 A1 | * | 4/2009 | Chen et al. ................... 714/727 |

* cited by examiner

*Primary Examiner*—Ha Tran T Nguyen
*Assistant Examiner*—Joshua Benitez
(74) *Attorney, Agent, or Firm*—Baker & McKenzie LLP (57) ABSTRACT

The invention provides a testing system and method suitable for determining whether the pins of the socket are properly connected to a printed circuit board. The testing system includes a testing signal source, a socket, a signal sensing unit, a fixing element, and an analysis unit. The signal sensing unit comprises a sensor board, a probe, and an operation amplifier. The sensor board is electrically coupled to the socket, and the sensor board has a probing point. The probe is selectively contacted with the probing point of the sensor board for receiving and outputting a sensing signal. The operation amplifier is electrically connected to the probe for receiving, amplifying and outputting the sensing signal. The fixing element is used for fixing the sensor board between the socket and the fixing element.

23 Claims, 9 Drawing Sheets

ELECTRONIC DEVICE TESTING SYSTEM AND METHOD

CROSS-REFERENCE TO RELATED APPLICATIONS

Not applicable.

FEDERALLY SPONSORED RESEARCH STATEMENT

Not applicable.

REFERENCE TO MICROFICHE APPENDIX

Not applicable.

FIELD OF THE INVENTION

The present invention relates to a testing system and method, particularity to a system and method of detecting whether the connection pins of a socket are properly connected to a printed circuit board.

BACKGROUND OF THE INVENTION

In the testing procedure for print circuit board assembly (PCBA), an important step in the front-end process is detecting whether the pins on integrated circuits (ICs), connectors and other electronic devices are properly connected to the printed circuit board. Such testing not only can increase product quality, it can also detect manufacturing defects in the front-end processes. Today, the "automatic optical inspection" method (AOI) has replaced the conventional manual inspections. The AOI method not only reduces cost and eliminates human errors, it also increases the speed of inspection. The "In Circuit Test" (ICT) provides another testing method. Under ICT, though it is required to fit different fixtures for different device under testing (DUT), the probes on the fixture are capable of detecting all the ICs on the printed circuit board assembly. Moreover, the fast testing speed, the accuracy of locating the defects, and a testing coverage rate higher than both automatic optical inspection and automatic X-ray inspection, are all noted advantages of ICT.

The Boundary-scan testing is also known as JTAG testing or IEEE1149.1. Such technique was proposed to IEEE committee by Join Testing Action Group (JTAG) in 1988, and the standard for "Standard Testing Access Port and Boundary-Scan Architecture" (IEEE std. 1149.1-1900) was established in 1990.

Figure 1A:
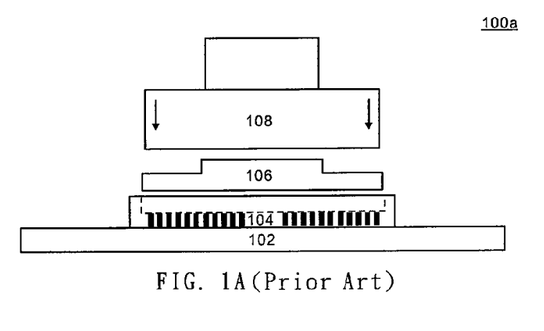
FIG. 1A shows a schematic of a conventional testing structure of the Boundary-scan testing.

Referring to FIG. 1A, it shows a schematic of a conventional testing structure of the Boundary-scan testing. The testing structure comprises a printed circuit board 102, a socket 104, a chipset 106, and a contact object 108. The socket 104 is fixed on the printed circuit board 102 by welding method for communicating with the printed circuit board 102. The chipset 106 is disposed over the socket 104 and electrically connected to the socket 104 for transmitting signal.

In the testing process, the IC with boundary-scan testing function (not shown) receives a testing data from the testing signal source and shifts the testing data to the boundary scan cells by serial inputting method. The testing data can then be serially transferred from the testing data output pin of the IC with boundary-scan testing function to the testing data input pin of the chipset 106, following a data shifting test in the boundary scan cells. The shifted data can be observed at the testing data output pin of the chipset 106.

In FIG. 1A, the chipset 106 is not pressed by the fixing element (not shown). Therefore, while the chipset 106 is pressed by the contact object 108, the chipset 106 can be electrically contacted to the socket 104. If the force pressed by the contact object 108 is sufficient, then the test result can match real life situation. In the testing structure, the back plate is not fixed to another surface of the printed circuit board 102 so that the testing data is transmitted to the printed circuit board 102. In the same way, a sensing signal can be detected on another surface of the printed circuit board 102. In FIG. 1A, the testing structure is used for detecting the connection between the printed circuit board 102 and the socket 104.

Figure 1B:
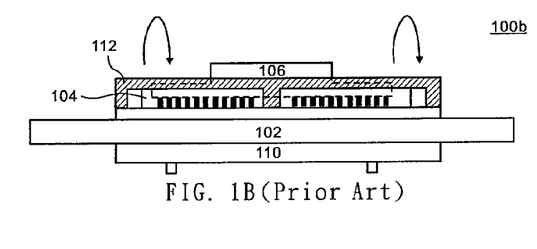
FIG. 1B shows another schematic of a conventional testing structure of the Boundary-scan testing.

Referring to FIG. 1B, it shows another schematic of a conventional testing structure of the Boundary-scan testing. The testing structure comprises a printed circuit board 102, a socket 104, a back plate 110, and a fixing element 112. The chipset 106 is plugged in the socket 104 and fixed by the fixing element 112. The testing method of FIG. 1B and FIG. 1A are the same and not explained here.

In the structure of the FIG. 1B, the back plate 110 is used for supporting the printed circuit board 102 against a force pressed by the fixing element 112. However, a testing point can not be tested by a probe due to the fact that the testing point is disposed in an area covered by the back plate 110. The testing point may be limited by the back plate 110 when the back plate 110 has been fixed to another surface of the printed circuit board 102. Therefore, the test data can not be obtained in the testing process.

In FIGS. 1A and 1B, the chipset 106 can be an actual central processing unit (CPU) or a Socket Test Technology (STT). The Socket Test Technology is manufactured by Intel Corporation. The size and the outward appearance of the Socket Test Technology are the same as those of the actual central processing unit. The difference between the actual central processing unit and the Socket Test Technology is the inner circuit.

In FIG. 1B, the testing structure is used for detecting the connection between the printed circuit board 102 and the socket 104, and the contact between the chipset 106 and the grids of the socket 104.

Figure 1C:
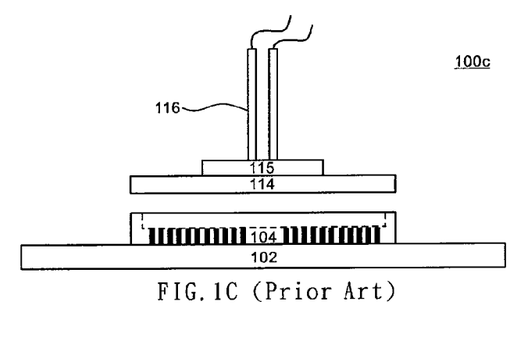
FIG. 1C shows another schematic of a conventional testing structure of the vectorless testing method.

FIG. 1C shows another schematic of a conventional testing structure. The testing structure 100c comprises a printed circuit board 102, a socket 104, a vectorless testing plate 114, an operation amplifier 115 and a probe 116. A testing data is transmitted to the socket 104 through the printed circuit board 102. The vectorless testing plate 114 is disposed over the socket 104 and electrically connected to operation amplifier 115. The operation amplifier 115 is electrically connected to the probe 116 for amplifying a sensing signal. The vectorless testing plate 114 is electrically coupled to the socket 104. The probe 116 is electrically connected to a signal processing unit (not shown).

The difference between FIG. 1C and FIG. 1A is that a sensing signal in 1C is generated by the vectorless testing plate 114 due to the electrically coupling between the vectorless testing plate 114 and the socket 104. The sensing signal is amplified by the operation amplifier 115 and outputted to the probe 116. The probe 116 transmits the sensing signal to the signal processing unit. A capacitance value can then be calculated by the sequential signal processing unit. Such a Capacitive Coupling Testing was first disclosed by Agilent Technologies in U.S. Pat. No. 5,254,953 in 1993, and it is now broadly adopted by the industry.

In FIG. 1C, the testing structure is used for detecting the connection between the printed circuit board 102 and the socket 104. However, after the step of reflow, the testing step has to rework if the fixing element and the back plate are fixed on the printed circuit board 102. And the fixing element and the back plate need to be removed while the testing step is reworked.

Figure 2:
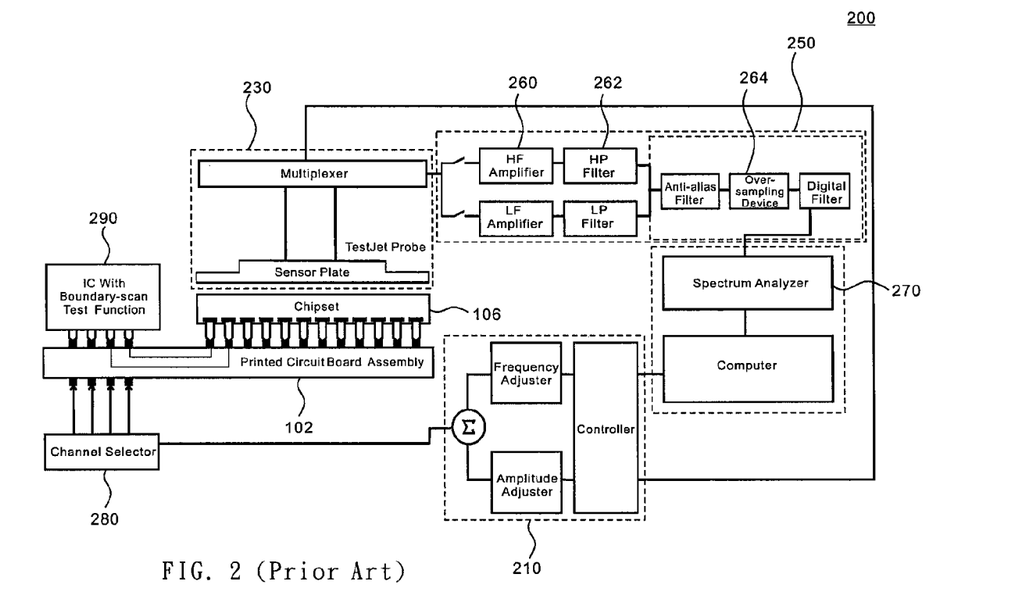
FIG. 2 shows a block diagram of a conventional testing system.

FIG. 2 shows a block diagram of a conventional testing system. In the conventional technology, the testing system 200 comprises a testing signal source 210, a signal sensing unit 230, a signal processing unit 250, a analysis unit 270, and an IC with boundary-scan testing function 290. The testing system is used for sensing whether the pins of the chipset 106 are properly connected to the printed circuit board 102.

Please refer to FIG. 2, the testing signal is outputted to the IC with boundary-scan testing function 290 by channel selector 280. The channel selector 280 will select a proper channel to deliver the signal, and the IC with boundary-scan testing function 290 will deliver the testing signal to the chipset 106 through the printed circuit board 102. The signal sensing unit 230 will then detect the sensing signal that corresponds to the testing signal.

The signal sensing unit 230 comprises a TestJet probe and a multiplex card to deliver the sensing signals to the signal processing unit 250. An analog signal amplifier 260 and a filter 262 are respectively disposed in the signal processing unit 250 for receiving the sensing signal and filtering the noise of the sensing signal. The analysis unit 270 will analyze the digital sensing signals. By determining whether the sensing signals fall within a range of predetermined reference values, the state of electrical connections of the pins can be determined.

In the conventional testing system 200, an operation amplifier is disposed on the sensor plate. The probe is in contact with the sensor plate. The capacitance value is inversely proportional to the distance between the sensor plate and the chipset 106. Since Chipset 106 can be a socket, connector, or integrated circuit, the capacitance value can not be easily determined. Moreover, the capacitance value may not be properly determined due to the fact that sensor plate and the chipset are not parallel.

As a result, it is necessary to introduce a new technique to address all the insufficiencies of the prior art. A testing system and method that overcome the obstacles of signal delivery is required to increase the coverage of inspection and to eliminate examination blind spots.

SUMMARY OF THE INVENTION

The invention provides a testing system and method for effectively detecting whether the pins of a socket are properly connected to a printed circuit board.

The present invention comprises a testing signal source, a socket, a signal sensing unit, a fixing element, and an analysis unit. The testing signal source generates and outputs a testing signal. The socket is electrically connected to the testing signal source for receiving the testing signal. The signal sensing unit comprises a sensor board, a probe, and an operation amplifier. The sensor board is electrically coupled to the socket, and the sensor board has a probing point. The probe selectively contacts with the probing point of the sensor board for receiving and outputting a sensing signal. The operation amplifier is electrically connected to the probe for receiving, amplifying and outputting the sensing signal. The fixing element is used to dispose the sensor board between the socket and the fixing element. The analysis unit is electrically connected to the operation amplifier for receiving and analyzing the sensing signal to determine whether the pins of the socket are properly connected to the printed circuit board.

In one aspect, the invention provides a testing system. The testing system comprises a testing signal source, a printed circuit board, a signal sensing unit, a fixing element, and an analysis unit. The testing signal source is used for generating and outputting a testing signal. The printed circuit board is electrically connected to the testing signal source for receiving the testing signal, and a socket is disposed on the printed circuit board. The signal sensing unit comprises a sensor board, a probe, and an operation amplifier. The sensor board is electrically coupled to the socket, and the sensor board has a probing point. The probe selectively contacts with the probing point of the sensor board for receiving and outputting a sensing signal. The operation amplifier is electrically connected to the probe for receiving, amplifying and outputting the sensing signal. The fixing element is used to dispose the sensor board between the socket and the fixing element. The analysis unit is electrically connected to the operation amplifier for receiving and analyzing the sensing signal to determine whether the pins of the socket are properly connected to the printed circuit board.

In another aspect, the invention provides a testing system. The testing system comprises a testing signal source, a printed circuit board, a socket, a signal sensing unit, a fixing element, and an analysis unit. The testing signal source is used for generating and outputting a testing signal. The printed circuit board is electrically connected the testing signal source for receiving and outputting the testing signal. The socket is electrically connected to the printed circuit board for receiving the testing signal. The signal sensing unit comprises a sensor board, a probe, and an operation amplifier. The sensor board is electrically coupled to the socket, and the sensor board has a probing point. The probe selectively contacts with the probing point of the sensor board for receiving and outputting a sensing signal. The operation amplifier is electrically connected to the probe for receiving, amplifying and outputting the sensing signal. The fixing element is used to dispose the sensor board between the socket and the fixing element. The analysis unit is electrically connected to the operation amplifier for receiving and analyzing the sensing signal to determine whether the pins of the socket are properly connected to the printed circuit board.

In another aspect, the invention provides a signal sensing unit used for detecting a socket. The signal sensing unit comprises a sensor board, a probe, and an operation amplifier. The sensor board has a probing point. The probe is disposed over the sensor board for selectively contacting with the probing point of the sensor board. The operation amplifier is disposed over the probe and electrically connected to the probe.

In another aspect, the invention provides a testing method suitable for a testing system. The testing system comprises a socket, a sensor board, a probe, and a fixing element, the sensor board fixed by the fixing element is disposed between the socket and the fixing element. The sensor board is electrically coupled to the socket. The testing method comprising: outputting a testing signal to the socket, wherein the testing signal is transferred through an integrated circuit with boundary-scan test function; probing the testing signal and generating a sensing signal; amplifying the sensing signal; and converting the sensing signal to frequency domain spectrum data, and determining whether the pins of the socket under testing are properly connected to the printed circuit board assembly.

The testing system and method of present invention provide an examination of a socket which electrically connects to a printed circuit board. Particularly, the present invention provides a solution to the problems of HDI technology. The testing signal source delivers the testing signal to the socket via the channel selector, the integrated circuit with boundary-scan test function and the printed circuit board. Thereafter, the testing signal can be detected by the sensing unit located a distance from the socket. This makes it possible to carry out an inspection even in a situation of high wire-density or on a probe-inaccessible surface.

DESCRIPTION OF EMBODIMENTS OF THE INVENTION

The present invention provides a system and method of inspection which can effectively detect whether the pins of the socket are properly connected to a printed circuit board assembly.

Figure 3:
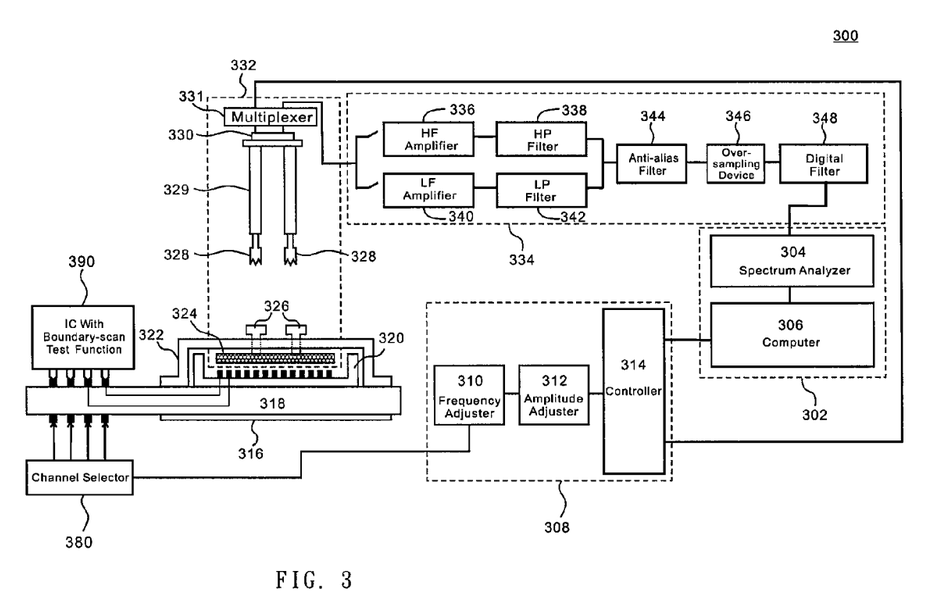
FIG. 3 shows a block diagram of the testing system according to an embodiment of the present invention.

FIG. 3 shows a block diagram of the testing system according to an embodiment of the present invention. The testing system 300 comprises an analysis unit 302, a testing signal source 308, a printed circuit board 318, a socket 320, a signal sensing unit 332, a channel selector 380, an integrated circuit with boundary-scan test function and a signal processing unit 334.

In this embodiment, the analysis unit 302 comprises a spectrum analyzer 304 and a computer 306. The computer 306 is used to output a control signal to the testing signal source 308 according to the user's operation. The control signal outputted from the computer 306 is given a properly control signal by the user's operation according to the characteristic of the printed circuit board 318 and the socket 320.

The testing signal source 308 comprises a frequency adjuster 310, an amplitude adjuster 312 and a signal source controller 314. The signal source controller 314 is electrically connected to the computer 306 and the amplitude adjuster 312 for receiving the control signal. A testing signal is generated by testing signal source 308 according to the control signal. The amplitude adjuster 312 is connected to the signal source controller. The frequency adjuster 310 is connected to the amplitude adjuster 312. One of ordinary skill in the art should know that sequence of the amplitude adjuster 312 and the frequency adjuster 310 can be changed. The present invention, however, is not limited thereto.

In an embodiment of the present invention, the frequency of the testing signals can adjust within the baseband of the expected testing signal source. For example, if the testing signals are expected to be harmonic signals with a frequency of 10 KHz, the baseband of testing signals can be 3.3 KHz. The amplitude specification of the testing signals is adjusted by the signal source controller 314 through the amplitude adjuster 312 before proceeding to an output. One of ordinary skill in the art should know that the testing signals can be harmonic signals. The present invention, however, is not limited thereto.

The channel selector 380 is electrically connected to the frequency adjuster 310 for receiving and selecting a proper channel to output the testing signal. The integrated circuit with boundary-scan test function 390 is electrically connected between the channel selector 380 and the printed circuit board 318 for receiving, shifting and outputting the testing signal.

The printed circuit board 318 is electrically connected to the integrated circuit with boundary-scan test function 390 and the socket 320 for receiving and outputting the testing signal. The testing signal from the integrated circuit with boundary-scan test function 390 is inputted to the socket 320 via the inner layer of the printed circuit board 318. One of ordinary skill in the art should know that the printed circuit board 318 can be a high density interconnect (HDI) four, six or eight layered printed circuit board, and its signal lines run in the inner layer of the printed circuit board 318. The present invention, however, is not limited thereto.

The socket 320 is electrically connected to the printed circuit board 318 for receiving the testing signal. One surface of the socket 320 is connected to the printed circuit board 318 by pins and welded on the printed circuit board 318 by Surface Mount Technology. Another surface of the socket 320 has a plurality of grids. And each of the plurality of grids has a raised tapering object. In an embodiment of the present invention, these pins at the under surface of the integrated circuit (not shown) are flat pads. The flat pads of the integrated circuit contact with the pins disposed in the grids of the socket 320. One of ordinary skill in the art should know that the connection between the socket 320 and the integrated circuit can be any type of connection, for example, grids-plate, grids-raised ball, slut-grids or other connection type. The present invention, however, is not limited thereto.

In an embodiment of the present invention, the socket 320 can be a LGA (Land Grid Array). The present invention, however, is not limited thereto. One of ordinary skill in the art should know that the integrated circuit can be the central processing unit, the north bridge chipset, the south bridge chipset, and the connector. The present invention, however, is not limited thereto.

In an embodiment of the present invention, the back plate 316 can be fixed on another surface due to the need for signal source of the printed circuit board 318. If the IC with boundary-scan testing function 390 is already disposed on the printed circuit board 318, the testing structure 300 can be implemented with the back plate 316. If the testing structure 300 does not have the IC with boundary-scan testing function 390, the back plate 316 can not be fixed on the printed circuit board 318.

The signal sensing unit 332 comprises a sensor board 324, a probe 328, a probe socket 329 and an operation amplifier 330. In this embodiment, two probes 328 are described. In a real life setting, the amount of the probe 328 can be adjusted according to the design condition. The present invention, however, is not limited thereto. The probe 328 is disposed in the probe socket 329.

In this embodiment, the sensor board 324 is electrically coupled to the socket 320. The sensor board 324 has two probing points 326. The probing points 326 are used for coupling with the grids of the socket 320. The sensor board 324 simulates the integrated circuit described above. In a real life setting, the amount of the probing points 326 can be adjusted according to the design condition. The present invention, however, is not limited thereto.

In an embodiment of the present invention, the probing point 326 can be a pad or a pillar. Furthermore, a through hole (not shown) is disposed on the sensor board 324. The pillar is disposed in and exposed by the through hole and can be made by conductive materials. The present invention, however, is not limited thereto.

Figure 6A:
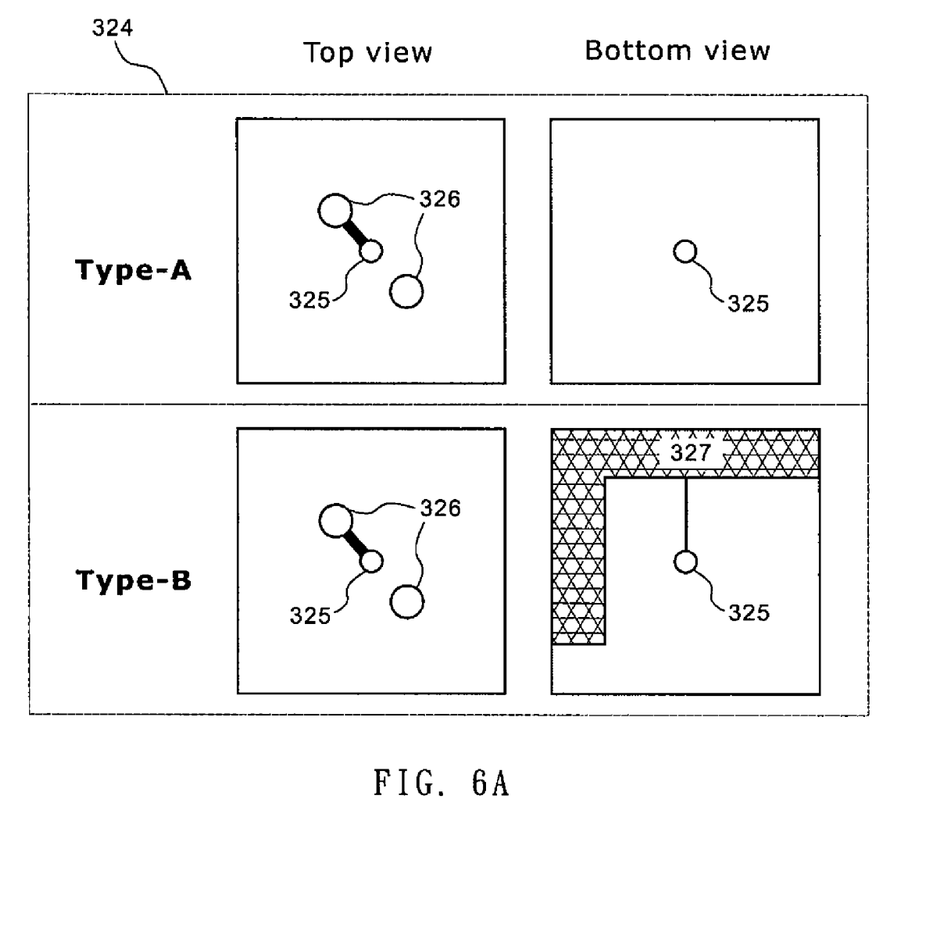
FIG. 6A shows two surfaces of the sensor board according to an embodiment of the present invention.

Please refer to FIG. 6A, type-A shows two surfaces of the sensor board according to an embodiment of the present invention. In the top view of the type-A, there are two probing points 326 and a signal transmitting media 325. The signal transmitting media 325 is connected to one of the probing points 326. As described above, the probing points 326 are pads.

In the bottom view of the type-A, the signal transmitting media 325 is used for transmitting the sensing signal generated by the coupling of the sensor board 324 and the socket 320. Furthermore, the signal transmitting media 325 of the bottom surface is used for transmitting the sensing signal to one of the probing points 326 of the top surface.

In the type-A of the FIG. 6A, the bottom surface is an input signal plate which expects the signal transmitting point 325, and the top surface is a ground plate which expects the signal transmitting point 325 and the probing points 326.

Refer to FIG. 6A, the arrangement of the top view of the type-A and type-B is the same and will not be explained here.

In the bottom view of the type-B, there are a signal transmitting media 325 and an input signal area 327. The input signal area 327 is used for receiving the sensing signal generated by the coupling of the sensor board 324 and the socket 320. The signal transmitting media 325 is electrically connected to the input signal area 327 for transmitting the sensing signal to one of the probing points 326 on the top surface. The grids corresponding to the input signal area 327 are predetermined testing grids. One of ordinary skill in the art should know that a shape of the input signal area 327 can be a square, circle, rectangle, triangle etc.

Figure 6B:
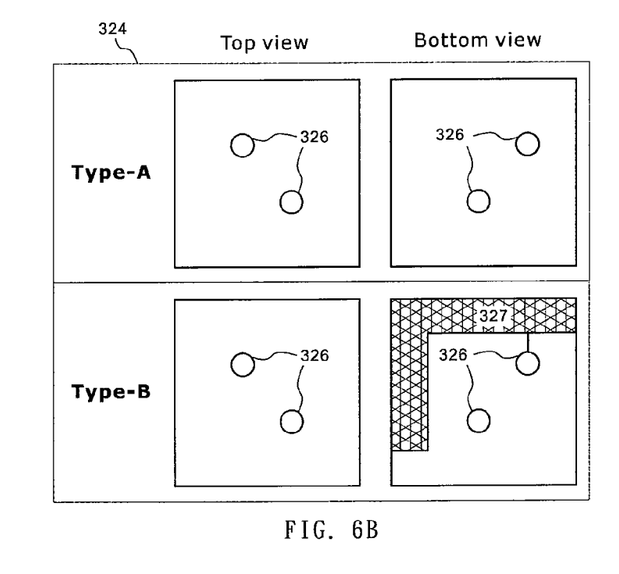
FIG. 6B shows two surfaces of the sensor board according to another embodiment of the present invention.

FIG. 6B shows two surfaces of the sensor board according to another embodiment of the present invention. The difference between FIG. 6A and FIG. 6B is the signal transmitting media 325. In the type-A of the FIG. 6B, the probing points 326 can be the through holes, and two pillars are respectively disposed in the through holes. Subsequently, the sensing signal can be detected by probe 328. In the type-A of the FIG. 6B, the bottom surface is an input signal plate which expects the probing points 326, and the top surface is a ground plate which expects the signal transmitting point 325 and the probing points 326. One of the probing points 326 is a signal point and another probing point 326 is a ground point.

In the type-B of the FIG. 6B, the input signal area 327 can be a signal input plate for receiving the sensing signal generated by the coupling of the sensor board 324 and the socket 320. One of the probing points 326 is electrically connected to the input signal area 327 for transmitting the sensing signal to the top surface. The grids corresponding to the input signal area 327 are predetermined testing grids. The testing signal can be transmitted in the sensor board 324. One of ordinary skill in the art should know that a shape of the input signal area 327 can be a square, circle, rectangle, triangle etc. In the type-B of FIG. 6B, the bottom surface is a ground plate which expects the input signal area 327 and the top surface is a ground plate. One of the probing points 326 which electrically connected to the input signal area 327 is a signal point and another probing point 326 is a ground point.

Figure 6C:
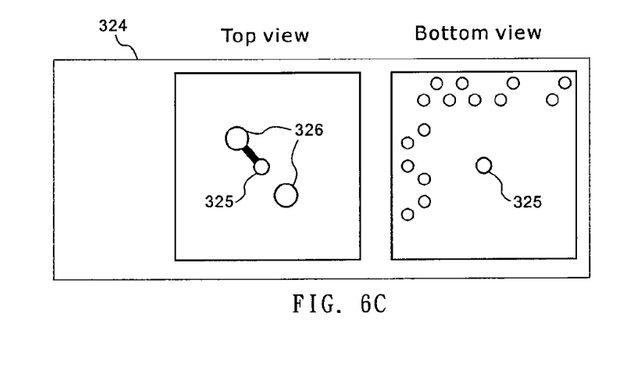
FIG. 6C shows two surfaces of the sensor board according to another embodiment of the present invention.

FIG. 6C shows two surfaces of the sensor board according to another embodiment of the present invention. In the top view of FIG. 6C, there are two probing points 326 and a signal transmitting media 325. The signal transmitting media 325 is connected to one of the probing points 326. As described above, the probing points 326 are pads.

In the bottom view of FIG. 6C, there are a plurality of input signal points and a signal transmitting media 325. The signal transmitting media 325 is used for transmitting the sensing signal generated by the coupling of the sensor board 324 and the socket 320. Furthermore, the signal transmitting media 325 of the bottom surface is used for transmitting the sensing signal to one of the probing points 326 of the top surface. The grids corresponding to the plurality of input signal points are predetermined testing grids.

One of ordinary skill in the art should know that the probing points 326 of FIG. 6C can be through holes. The present invention, however, is not limited thereto.

The probe 328 is used for contacting with the probing point 326 of the sensor board 324 in order to receive and output a sensing signal. The operation amplifier 330 is electrically connected between the probe 328 and the signal processing unit 334 for receiving, amplifying and outputting the sensing signal. The probe 328 is disposed in a probe socket 329.

In an embodiment of the present invention, a capacitance value is detected by the probe 328. The capacitance value is inversely proportional to the distance between the sensor board 324 and the pad. The sensing signal is an analog capacitance value.

The fixing element 322 is used for fixing the sensor board 324 between the socket 320 and the fixing element 322. While the fixing element 322 is fixed, the sensor board 324 is pressed by a normal force downward to the sensor board 324.

In an embodiment of the present invention, the fixing element 322 can be an Independent Loading Mechanism (ILM). The present invention, however, is not limited thereto.

In an embodiment of the present invention, a multiplexer 331 can be connected between the operation amplifier 320 and the signal processing unit 334. The multiplexer 331 is used for receiving, multiplexing and outputting the sensing signal.

The signal processing unit 334 comprises a high frequency signal filter 338, a low frequency signal filter 342, a anti-alias filter 344, a over sampling device 346, and an adjustable digital filer 348. The high frequency signal amplifier 336 and the low frequency signal amplifier 340 are selectively connected to the multiplexer 331. The high frequency signal filter 338 is electrically connected to the high frequency signal amplifier 336 and the anti-alias filter 344, the low frequency signal filter 342 is electrically connected to the low frequency signal amplifier 340 and the anti-alias filter 344. The over sampling device 346 is electrically connected to the anti-alias filter 344 and the adjustable digital filer 348.

In this embodiment, the high frequency signal amplifier 336, the high frequency signal filter 338, the low frequency signal amplifier 340 and the low frequency signal filter 342 are analog signal amplifiers and filters for amplifying, filtering, and outputting the analog signal to the anti-alias filter 344.

The analog sensing signal is filtered and over-sampled by the anti-alias filter 344 and the over sampling device 346. The analog sensing signal is outputted to the adjustable filter 348 after the analog sensing signal is transferred into a spectrum data.

A spectrum analyzer 304 of the analysis unit 302 receives the spectrum data to determine whether the pins of the socket 320 are properly connected to the printed circuit board 318. Subsequently, the result of the spectrum analyzer 304 can be transmitted to the computer 306 for storing.

In an embodiment of the present invention, the back plate 316 is fixed on printed circuit board 318.

Figure 7A:
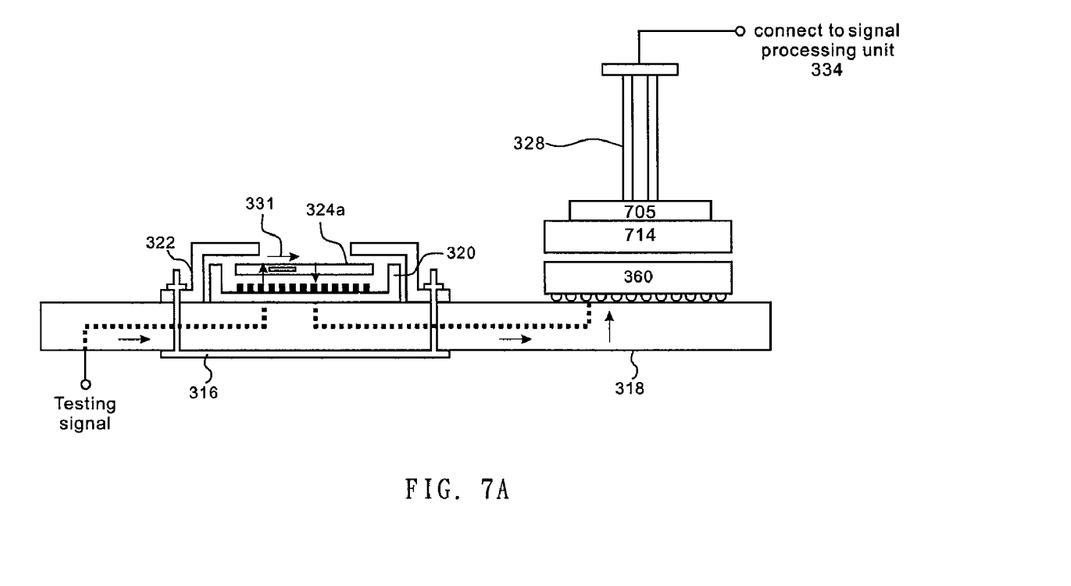
FIG. 7A shows a testing system according to another embodiment of the present invention.

FIG. 7A shows a testing system according to another embodiment of the present invention. The testing system comprises a printed circuit board 318, a socket 320, a socket 324a, a fixing element 322, a chipset 360, a vectorless testing plate 714, an operation amplifier 705 and two probes 328.

In this embodiment, a testing signal is inputted to the printed circuit board 318. The socket 320 and the chipset 360 are disposed on the printed circuit board 318 respectively. The socket 320 has a plurality of grids.

A first sensor board 324a is electrically connected to the plurality of grids of the socket 320 for receiving and outputting the testing signal. The first sensor board 324a is pressed by the fixing element 322.

Figure 7B:
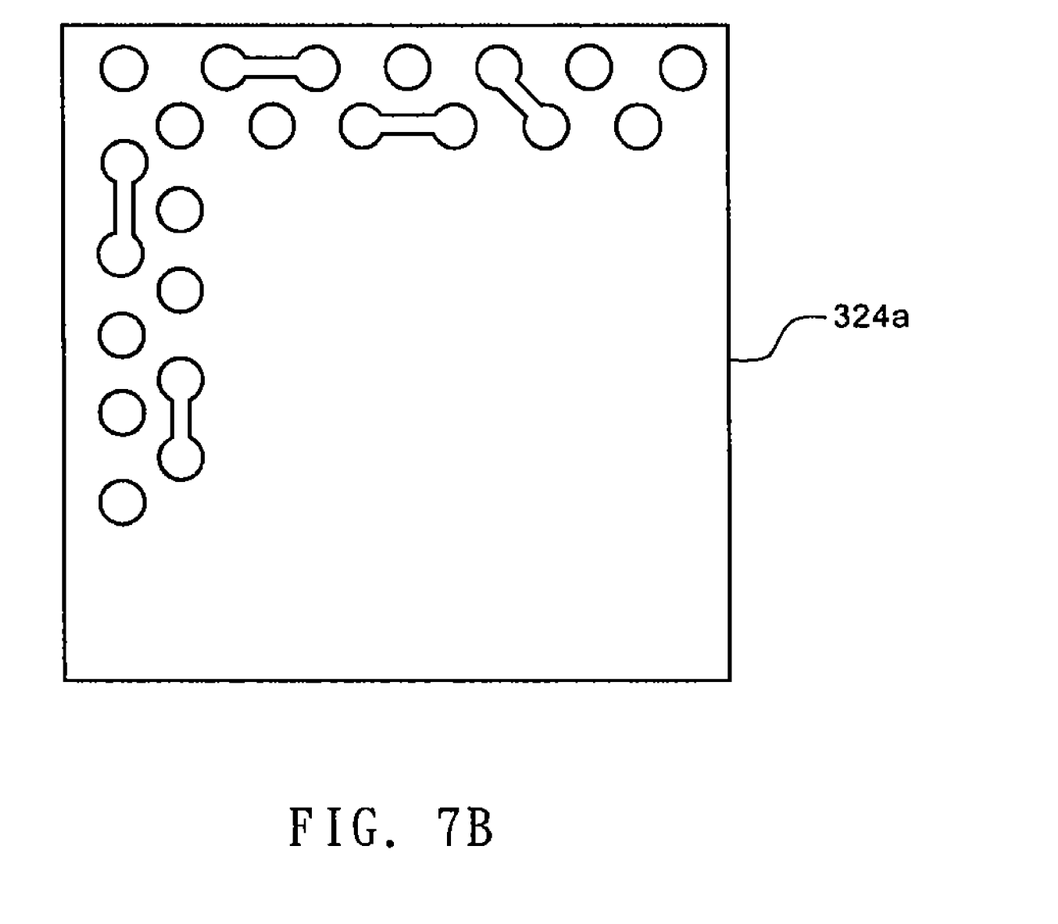
FIG. 7B shows a bottom surface of the sensor board according to another embodiment of the present invention.

FIG. 7B shows a bottom surface of the sensor board according to another embodiment of the present invention. There is a plurality of signal input points disposed on the bottom surface according to which grids of the socket 320 should be detected. The plurality of signal input points is electrically connected to the grids of the socket 320. Some signal input points are electrically connected together for transmitting testing signal (as shown in arrowhead 331). In other words, one signal input point receives the testing signal and transmits the testing signal to another signal input point via sensor board 324a. Then, another signal input point receives the testing signal and transmits the testing signal to the printed circuit board 318 via the grids of the socket 320.

Referring to FIG. 7A, the chipset 360 is electrically connected to the printed circuit board 318 for receiving the testing signal. A vectorless testing plate 714 is disposed over the chipset 360 for coupling the chipset 360. A sensing signal is inputted into the operation amplifier 705 for amplifying. The probe 328 transmits the sensing signal and outputs it to the signal processing unit 334 (as shown in FIG. 3).

There is a distance between the vectorless testing plate 714 and the chipset 360. In other words, the vectorless testing plate 714 and the chipset 360 are disposed in a non-contact method.

One of ordinary skill in the art should know that chipset 360 can be a socket, a connector, the south bridge chipset, the north bridge chipset, or any integrated circuit. The present invention, however, is not limited thereto.

Therefore, the testing system can detect not only the connection between the socket 320 and the printed circuit board 318 but also chipset 360 and the printed circuit board 318.

Figure 4:
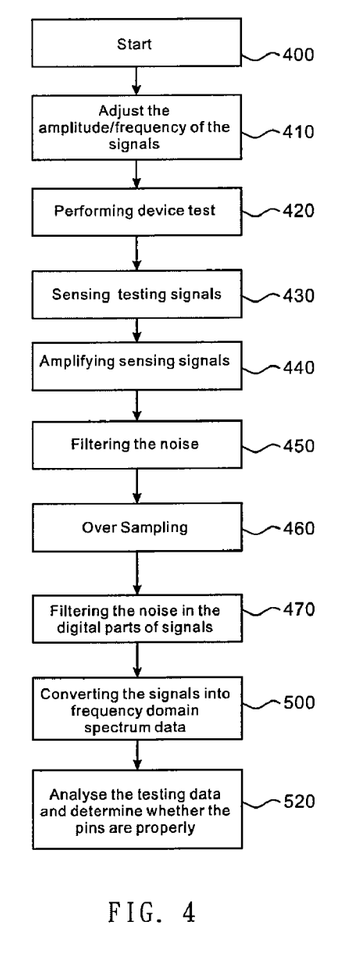
FIG. 4 shows the flow chart of the testing method by using the testing system according to an embodiment of the present invention.
Figure 5:
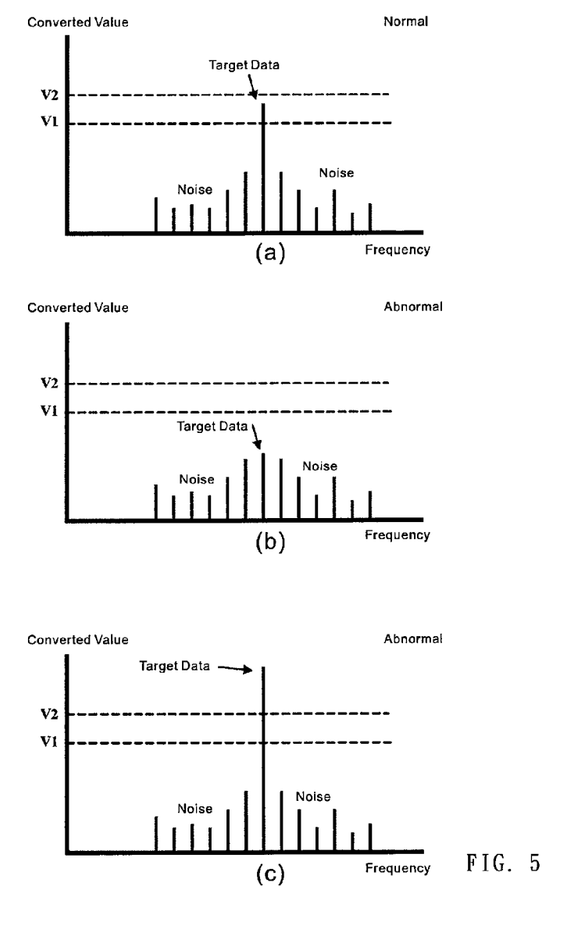
FIGS. 5A, 5B and 5C show the spectrum analysis according to an embodiment of the present invention.

FIG. 4 shows a flowchart of testing method according to an embodiment of the present invention. The testing method is suitable for a testing system that comprises a socket, a sensor board, a probe and a fixing element. The sensor board is fixed by the fixing element to locate between the socket and the fixing element.

In this embodiment, the step of the testing method comprises:

Step 400 is the initial setting of the testing system.

The amplitude or frequency is adjusted in step 410, and the device is tested in step 420 to obtain the testing output signals.

The following steps of 430 to 470 respectively are sensing testing signals (step 430), amplifying sensing signals (step 440), filtering the noise (step 450), over sampling (step 460) and filtering the noise of the digital parts of the signals (step 470).

Subsequently, the testing signals received will be converted to frequency domain spectrum data in step 500.

Finally, the testing output data will be analyzed in step 520, and whether the pins are properly connected will be determined.

In one embodiment, step 520 is carried out by using FIGS. 4A to 4C to analyze the test result. For example, if the sensing signal falls within a predetermined range of converting values, it will be read as correct signals. However, if the testing output signals fall below or above the predetermined range of converting values, it will be read as incorrect ones.

Thereafter, the step 400 to step 520 can be repeated until every pin of the socket is tested.

The present invention provides a system and method of inspection which can effectively detect whether the connection pins of the socket are properly connected to a printed circuit board assembly.

The testing system and method of the present invention provide the detection of a socket that electrically connects to a printed circuit board through the inner layer of the device. Particularly, the present invention provides a solution to the problems of HDI technology. The signal sensing unit delivers the testing signal to the socket via the channel selector, the integrated circuit with boundary-scan test function and the printed circuit board. Thereafter, the testing signal can be detected by the sensing unit located a distance from the socket. This makes it possible to carry out an inspection even in a situation of high wire-density or on a probe-inaccessible surface.

While the present invention is disclosed by reference to the preferred embodiments and examples detailed above, it is to be understood that these embodiments and examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A testing system, comprising:
    a testing signal source used for generating and outputting a testing signal;
    a socket electrically connected to the testing signal source for receiving the testing signal;
    a signal sensing unit, comprising:
        a sensor board electrically coupled to the socket, and the sensor board having a probing point;
        a probe selectively contacted with the probing point of the sensor board for receiving and outputting a sensing signal; and
        an operation amplifier electrically connected to the probe for receiving, amplifying and outputting the sensing signal;
    a fixing element used for fixing the sensor board between the socket and the fixing element; and
    an analysis unit electrically connected to the operation amplifier for receiving and analyzing the sensing signal to determine whether one or more pins of the socket are properly connected.

2. The testing system according to claim 1, further comprising a signal processing unit electrically connected between the probe and the analysis unit for receiving, amplifying, and filtering the sensing signal.

3. The testing system according to claim 1, further comprising:
a channel selector electrically connected between the testing signal source and the socket for receiving and selecting a proper channel to output the testing signal; and
an integrated circuit with boundary-scan test function electrically connected between the channel selector and the socket for receiving, shifting and outputting the testing signal.

4. The testing system according to claim 1, wherein the probing point is a pad.

5. The testing system according to claim 1, wherein the probing point is a pillar.

6. The testing system according to claim 5, wherein the sensor board has a through hole and the pillar is disposed in and exposed by the through hole.

7. The testing system according to claim 1, wherein the sensing signal is a capacitance value.

8. A testing system, comprising:
a testing signal source used for generating and outputting a testing signal;
a printed circuit board electrically connected to the testing signal source for receiving the testing signal, and a socket is disposed on the printed circuit board;
a signal sensing unit, comprising:
a sensor board electrically coupled to the socket, and the sensor board having a probing point;
a probe selectively contacted with the probing point of the sensor board for receiving and outputting a sensing signal; and
an operation amplifier electrically connected to the probe for receiving, amplifying and outputting the sensing signal;
a fixing element used for fixing the sensor board between the socket and the fixing element; and
an analysis unit electrically connected to the operation amplifier for receiving and analyzing the sensing signal to determine whether one or more pins of the socket are properly connected to the printed circuit board.

9. The testing system according to claim 8, further comprising a signal processing unit electrically connected between the probe and the analysis unit for receiving, amplifying, and filtering the sensing signal.

10. The testing system according to claim 8, further comprising:
a channel selector electrically connected between the testing signal source and the printed circuit board for receiving and selecting a proper channel to output the testing signal; and
an integrated circuit with boundary-scan test function electrically connected to the printed circuit board for receiving, shifting and outputting the testing signal.

11. The testing system according to claim 8, wherein the probing point is a pad.

12. The testing system according to claim 8, wherein the probing point is a pillar.

13. The testing system according to claim 12, wherein the sensor board has a through hole and the pillar is disposed in and exposed by the through hole.

14. The testing system according to claim 8, wherein the sensing signal is a capacitance value.

15. A testing system, comprising:
a testing signal source used for generating and outputting a testing signal;
a printed circuit board electrically connected to the testing signal source for receiving and outputting the testing signal;
a socket electrically connected to the printed circuit board for receiving the testing signal;
a signal sensing unit, comprising:
a sensor board electrically coupled to the socket, and the sensor board having a probing point;
a probe selectively contacted with the probing point of the sensor board for receiving and outputting a sensing signal; and
an operation amplifier electrically connected to the probe for receiving, amplifying and outputting the sensing signal;
a fixing element used for fixing the sensor board between the socket and the fixing element; and
an analysis unit electrically connected to the operation amplifier for receiving and analyzing the sensing signal to determine whether one or more pins of the socket are properly connected to the printed circuit board.

16. The testing system according to claim 15, further comprising a signal processing unit electrically connected between the probe and the analysis unit for receiving, amplifying, and filtering the sensing signal.

17. The testing system according to claim 16, further comprising:
a channel selector electrically connected between the testing signal source and the printed circuit board for receiving and selecting a proper channel to output the testing signal; and
an integrated circuit with boundary-scan test function electrically connected to the printed circuit board for receiving, shifting and outputting the testing signal.

18. The testing system according to claim 15, wherein the probing point is a pad.

19. The testing system according to claim 15, wherein the probing point is a pillar.

20. The testing system according to claim 19, wherein the sensor board has a through hole and the pillar is disposed in and exposed by the through hole.

21. The testing system according to claim 15, wherein the socket is disposed on the printed circuit board.

22. The testing system according to claim 15, wherein the sensing signal is a capacitance value.

23. A signal testing unit for detecting whether a socket is properly connected on a printed circuit board, the signal testing unit comprising:
a sensor board electrically coupled to the socket, and the sensor board having a probing point;
a probe disposed over the sensor board for selectively contacting with the probing point of the sensor board;
a fixing element fixing the sensor board between the socket and the fixing element; and
an operation amplifier disposed over the probe and electrically connected to the probe, wherein the printed circuit board is electrically connected to a testing signal source for receiving a testing signal and the socket is disposed on the printed circuit board.

* * * * *